(12) United States Patent
Jung et al.

(10) Patent No.: US 10,748,828 B2
(45) Date of Patent: Aug. 18, 2020

(54) FAN-OUT SENSOR PACKAGE

(71) Applicant: SAMSUNG ELECTRO-MECHANICS CO., LTD., Suwon-Si, Gyeonggi-Do (KR)

(72) Inventors: Ha Yong Jung, Suwon-Si (KR); Jae Kul Lee, Suwon-Si (KR); Ji Hye Shim, Suwon-Si (KR); Han Sang Cho, Suwon-Si (KR); Woon Ha Choi, Suwon-Si (KR); Jae Min Choi, Suwon-Si (KR); Dong Jin Kim, Suwon-Si (KR); Sung Taek Woo, Suwon-Si (KR)

(73) Assignee: SAMSUNG ELECTRO-MECHANICS CO., LTD., Suwon-si, Gyeonggi-Do (KR)

( * ) Notice: Subject to any disclaimer, the term of this patent is extended or adjusted under 35 U.S.C. 154(b) by 39 days.

(21) Appl. No.: 16/132,919

(22) Filed: Sep. 17, 2018

(65) Prior Publication Data

US 2019/0237375 A1 Aug. 1, 2019

(30) Foreign Application Priority Data

Jan. 31, 2018 (KR) .......................... 10-2018-0011751

(51) Int. Cl.
*H01L 23/31* (2006.01)
*H01L 23/522* (2006.01)
(Continued)

(52) U.S. Cl.
CPC ........ *H01L 23/3114* (2013.01); *H01L 23/481* (2013.01); *H01L 23/49816* (2013.01);
(Continued)

(58) Field of Classification Search
CPC ........ H05K 1/0231; H01L 2224/04105; H01L 23/642
See application file for complete search history.

(56) References Cited

U.S. PATENT DOCUMENTS 6,982,491 B1 * 1/2006 Fan ...................... B81B 7/0077
257/370
7,525,139 B2 4/2009 Yang et al.
(Continued)

FOREIGN PATENT DOCUMENTS

KR 10-2006-0075794 A 7/2006
KR 10-2008-0063223 A 7/2008
(Continued)

OTHER PUBLICATIONS

Office Action issued in Taiwanese Patent Application No. 107132224 dated Aug. 8, 2019, with English translation.
(Continued)

*Primary Examiner* — William F Kraig
*Assistant Examiner* — Khatib A Rahman
(74) *Attorney, Agent, or Firm* — Morgan, Lewis & Bockius LLP

(57) ABSTRACT

A fan-out sensor package includes: a redistribution portion having a through-hole and including a wiring layer and vias; a first semiconductor chip having an active surface having a sensing region of which at least a portion is exposed through the through-hole and first connection pads disposed in the vicinity of the sensing region; a second semiconductor chip disposed side by side with the first semiconductor chip in a horizontal direction and having second connection pads; dam members disposed in the vicinity of the first connection pads; an encapsulant encapsulating the redistribution portion, the first semiconductor chip, and the second semiconductor chip; and electrical connection structures electrically connecting the first connection pads and the second connec-
(Continued)

tion pads to the wiring layer or the vias of the redistribution portion.

11 Claims, 11 Drawing Sheets

(51) Int. Cl.
  *H01L 23/498* (2006.01)
  *H01L 23/48* (2006.01)
  *H01L 23/00* (2006.01)
  *H01L 27/146* (2006.01)
(52) U.S. Cl.
  CPC ...... *H01L 23/49827* (2013.01); *H01L 23/522* (2013.01); *H01L 24/02* (2013.01); *H01L 27/14618* (2013.01); *H01L 2224/02379* (2013.01); *H01L 2224/04105* (2013.01); *H01L 2224/18* (2013.01); *H01L 2924/14* (2013.01); *H01L 2924/15311* (2013.01)

(56) References Cited

U.S. PATENT DOCUMENTS

| | | | | |
|---|---|---|---|---|
| 2008/0083980 | A1* | 4/2008 | Yang | H01L 27/14683 257/700 |
| 2008/0157312 | A1* | 7/2008 | Yang | H01L 27/14618 257/678 |
| 2008/0191297 | A1* | 8/2008 | Yang | H01L 27/14618 257/432 |
| 2008/0274579 | A1* | 11/2008 | Yang | H01L 27/14618 438/64 |
| 2013/0056844 | A1 | 3/2013 | Oganesian | |
| 2013/0069252 | A1* | 3/2013 | Han | H01L 31/1876 257/787 |
| 2013/0318785 | A1* | 12/2013 | Hsu | H05K 3/108 29/850 |
| 2014/0269804 | A1* | 9/2014 | Lai | H01S 5/0262 372/50.21 |
| 2017/0287853 | A1 | 10/2017 | Kim et al. | |
| 2018/0090530 | A1* | 3/2018 | Jeong | H01L 27/14627 |

FOREIGN PATENT DOCUMENTS

| | | |
|---|---|---|
| KR | 10-2008-0075450 A | 8/2008 |
| KR | 101453158 B1 | 10/2014 |
| KR | 10-2017-0112907 A | 10/2017 |

OTHER PUBLICATIONS

Korean Office Action dated Jan. 11, 2019 issued in Korean Patent Application No. 10-2018-0011751 (with English translation).

\* cited by examiner

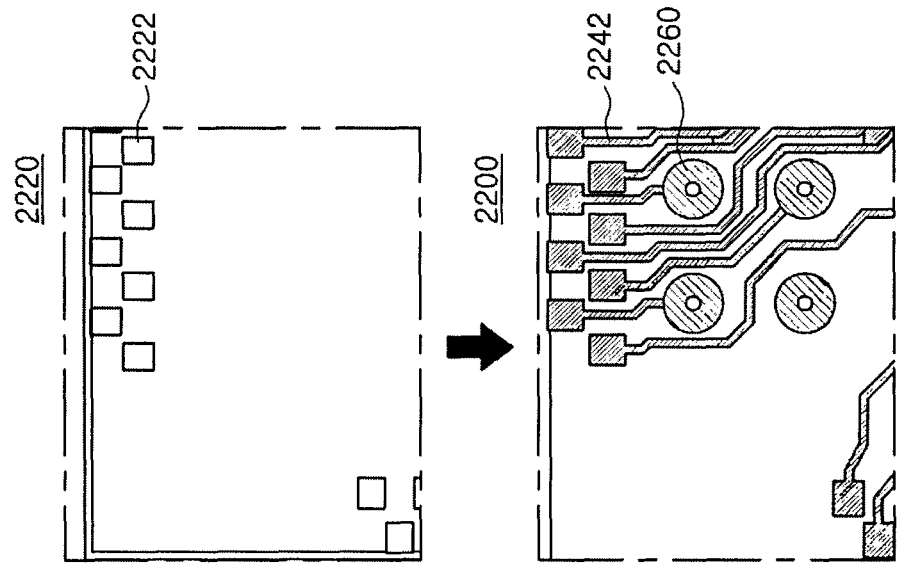
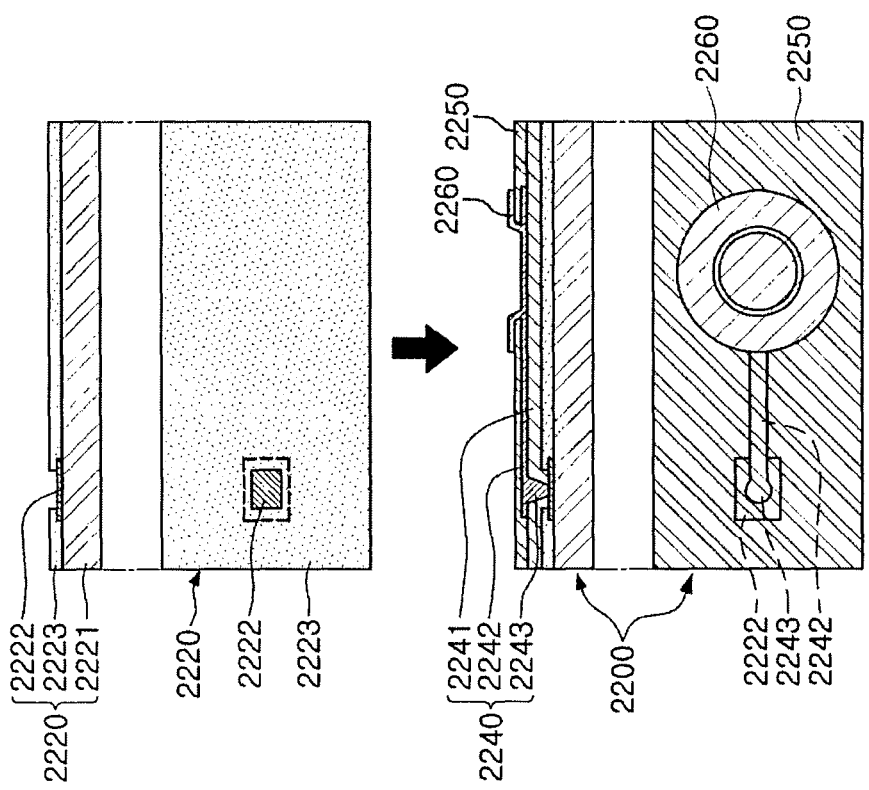
FIG. 3B
FIG. 3A

FAN-OUT SENSOR PACKAGE

CROSS-REFERENCE TO RELATED APPLICATION(S)

This application claims the benefit of priority to Korean Patent Application No. 10-2018-0011751 filed on Jan. 31, 2018, in the Korean Intellectual Property Office, the disclosure of which is incorporated herein by reference in its entirety.

TECHNICAL FIELD

The present disclosure relates to a fan-out sensor package.

BACKGROUND

In packaging technology of devices used in mobile products such as smartphones or tablet personal computers (PCs), miniaturization and performance improvement of packages have been continuously demanded. That is, efforts to manufacture the packages at a small size and add more functions in the same space have been conducted. Particularly, a demand for miniaturization of components having additional functions rather than a main component has further increased. For example, a demand for miniaturization and performance improvement of a first semiconductor chip package used in a camera module, or the like, has increased.

SUMMARY

An aspect of the present disclosure may provide a fan-out sensor package of which a manufacturing yield may be improved.

According to an aspect of the present disclosure, a fan-out sensor package may include: a redistribution portion having a through-hole and including a wiring layer and vias; a first semiconductor chip having an active surface having a sensing region of which at least a portion is exposed through the through-hole and first connection pads disposed in the vicinity of the sensing region; a second semiconductor chip disposed side by side with the first semiconductor chip in a horizontal direction and having second connection pads; dam members disposed in the vicinity of the first connection pads; an encapsulant encapsulating the redistribution portion, the first semiconductor chip, and the second semiconductor chip; and electrical connection structures electrically connecting the first connection pads and the second connection pads to the wiring layer or the vias of the redistribution portion.

BRIEF DESCRIPTION OF DRAWINGS

The above and other aspects, features, and advantages of the present disclosure will be more clearly understood from the following detailed description taken in conjunction with the accompanying drawings, in which:

FIGS. 3A and 3B are schematic cross-sectional views illustrating states of a fan-in semiconductor package before and after being packaged;

DETAILED DESCRIPTION

Figure 1:
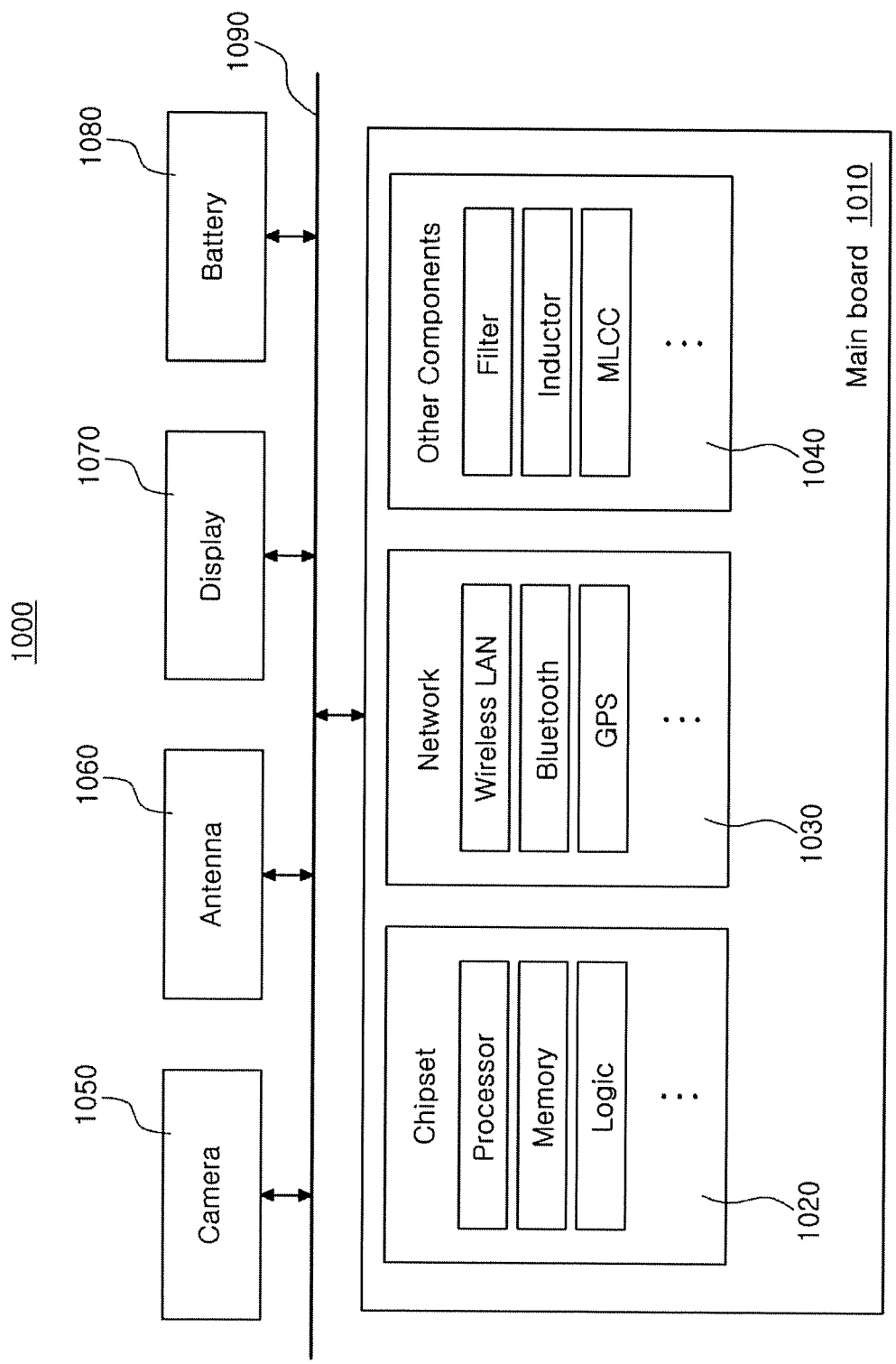
FIG. 1 is a schematic block diagram illustrating an example of an electronic device system.

Hereinafter, exemplary embodiments of the present disclosure will now be described in detail with reference to the accompanying drawings. In the accompanying drawings, shapes, sizes, and the like, of components may be exaggerated or stylized for clarity.

The present disclosure may, however, be exemplified in many different forms and should not be construed as being limited to the specific embodiments set forth herein. Rather these embodiments are provided so that this disclosure will be thorough and complete, and will fully convey the scope of the disclosure to those skilled in the art.

The term "an exemplary embodiment" used herein does not refer to the same exemplary embodiment, and is provided to emphasize a particular feature or characteristic different from that of another exemplary embodiment. However, exemplary embodiments provided herein are considered to be able to be implemented by being combined in whole or in part one with another. For example, one element described in a particular exemplary embodiment, even if it is not described in another exemplary embodiment, may be understood as a description related to another exemplary embodiment, unless an opposite or contradictory description is provided therein.

The meaning of a "connection" of a component to another component in the description includes an indirect connection through a third component as well as a direct connection between two components. In addition, "electrically connected" means the concept including a physical connection and a physical disconnection. It can be understood that when an element is referred to with "first" and "second", the element is not limited thereby. They may be used only for a purpose of distinguishing the element from the other elements, and may not limit the sequence or importance of the elements. In some cases, a first element may be referred to as a second element without departing from the scope of the claims set forth herein. Similarly, a second element may also be referred to as a first element.

Herein, an upper portion, a lower portion, an upper side, a lower side, an upper surface, a lower surface, and the like, are decided in the accompanying drawings. For example, a first connection member is disposed on a level above a redistribution layer. However, the claims are not limited thereto. In addition, a vertical direction refers to the abovementioned upward and downward directions, and a horizontal direction refers to a direction perpendicular to the abovementioned upward and downward directions. In this case, a vertical cross section refers to a case taken along a plane in the vertical direction, and an example thereof may be a cross-sectional view illustrated in the drawings. In addition, a horizontal cross section refers to a case taken along a plane in the horizontal direction, and an example thereof may be a plan view illustrated in the drawings.

Terms used herein are used only in order to describe an exemplary embodiment rather than limiting the present disclosure. In this case, singular forms include plural forms unless interpreted otherwise in context.

Electronic Device

FIG. 1 is a schematic block diagram illustrating an example of an electronic device system.

Referring to FIG. 1, an electronic device 1000 may accommodate a mainboard 1010 therein. The mainboard 1010 may include chip related components 1020, network related components 1030, other components 1040, and the like, physically or electrically connected thereto. These components may be connected to others to be described below to form various signal lines 1090.

The chip related components 1020 may include a memory chip such as a volatile memory (for example, a dynamic random access memory (DRAM)), a non-volatile memory (for example, a read only memory (ROM)), a flash memory, or the like; an application processor chip such as a central processor (for example, a central processing unit (CPU)), a graphics processor (for example, a graphics processing unit (GPU)), a digital signal processor, a cryptographic processor, a microprocessor, a microcontroller, or the like; and a logic chip such as an analog-to-digital (ADC) converter, an application-specific integrated circuit (ASIC), or the like. However, the chip related components 1020 are not limited thereto, but may also include other types of chip related components. In addition, the chip related components 1020 may be combined with each other.

The network related components 1030 may include protocols such as wireless fidelity (Wi-Fi) (Institute of Electrical And Electronics Engineers (IEEE) 802.11 family, or the like), worldwide interoperability for microwave access (Wi-MAX) (IEEE 802.16 family, or the like), IEEE 802.20, long term evolution (LTE), evolution data only (Ev-DO), high speed packet access+ (HSPA+), high speed downlink packet access+ (HSDPA+), high speed uplink packet access+ (HSUPA+), enhanced data GSM environment (EDGE), global system for mobile communications (GSM), global positioning system (GPS), general packet radio service (GPRS), code division multiple access (CDMA), time division multiple access (TDMA), digital enhanced cordless telecommunications (DECT), Bluetooth, 3G, 4G, and 5G protocols, and any other wireless and wired protocols, designated after the abovementioned protocols. However, the network related components 1030 are not limited thereto, but may also include a variety of other wireless or wired standards or protocols. In addition, the network related components 1030 may be combined with each other, together with the chip related components 1020 described above.

Other components 1040 may include a high frequency inductor, a ferrite inductor, a power inductor, ferrite beads, a low temperature co-fired ceramic (LTCC), an electromagnetic interference (EMI) filter, a multilayer ceramic capacitor (MLCC), or the like. However, other components 1040 are not limited thereto, but may also include passive components used for various other purposes, or the like. In addition, other components 1040 may be combined with each other, together with the chip related components 1020 or the network related components 1030 described above.

Depending on a type of the electronic device 1000, the electronic device 1000 may include other components that may or may not be physically or electrically connected to the mainboard 1010. These other components may include, for example, a camera module 1050, an antenna 1060, a display device 1070, a battery 1080, an audio codec (not illustrated), a video codec (not illustrated), a power amplifier (not illustrated), a compass (not illustrated), an accelerometer (not illustrated), a gyroscope (not illustrated), a speaker (not illustrated), a mass storage unit (for example, a hard disk drive) (not illustrated), a compact disk (CD) drive (not illustrated), a digital versatile disk (DVD) drive (not illustrated), or the like. However, these other components are not limited thereto, but may also include other components used for various purposes depending on a type of electronic device 1000, or the like.

The electronic device 1000 may be a smartphone, a personal digital assistant (PDA), a digital video camera, a digital still camera, a network system, a computer, a monitor, a tablet PC, a laptop PC, a netbook PC, a television, a video game machine, a smartwatch, an automotive component, or the like. However, the electronic device 1000 is not limited thereto, but may be any other electronic device processing data.

Figure 2:
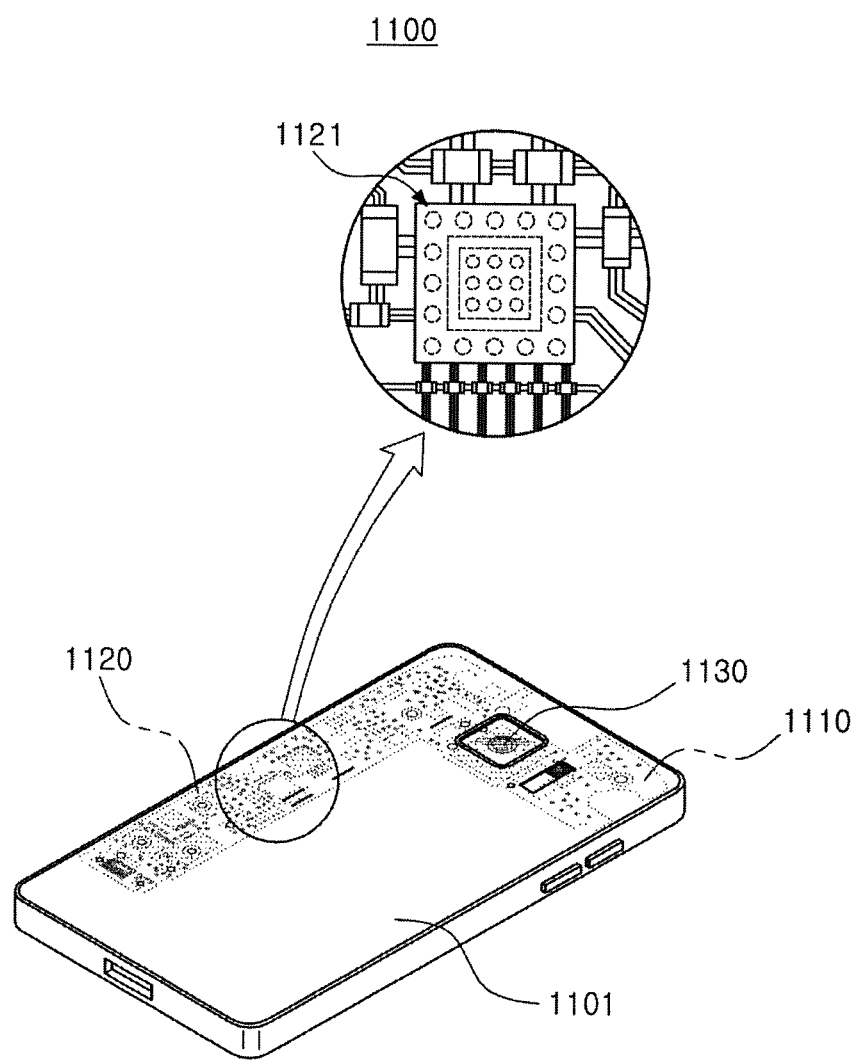
FIG. 2 is a schematic perspective view illustrating an example of an electronic device.

FIG. 2 is a schematic perspective view illustrating an example of an electronic device.

Referring to FIG. 2, an electronic device may be, for example, a smartphone 1100. A mainboard 1110 may be accommodated in a body 1101 of the smartphone 1100, and various electronic components 1120 such as a semiconductor package 1121 may be physically or electrically connected to the mainboard 1110. In addition, other components that may or may not be physically or electrically connected to the mainboard 1110, such as the camera module 1130, may be accommodated in the body 1101. The camera module 1130 may include a first semiconductor chip package, and a fan-out sensor package according to the present disclosure may be used in the smartphone. Meanwhile, the electronic device in which the fan-out sensor package according to the present disclosure is used is not limited to the smartphone 1100. That is, the fan-out sensor package according to the present disclosure may also be used in other electronic devices.

Semiconductor Package

A fan-out sensor package according to the present disclosure may be manufactured using technology of a semiconductor package. Generally, numerous fine electrical circuits are integrated in a semiconductor. However, the semiconductor may not serve as a finished semiconductor product in itself, and may be damaged due to external physical or chemical impacts. Therefore, the semiconductor itself may not be used, but may be packaged and used in an electronic device, or the like, in a packaged state.

Here, semiconductor packaging is required due to the existence of a difference in a circuit width between the semiconductor and a mainboard of the electronic device in terms of electrical connections. In detail, a size of first connection pads of the semiconductor and an interval between the first connection pads of the semiconductor are very fine, but a size of component mounting pads of the mainboard and an interval between the component mounting pads of the mainboard are significantly larger than those of the semiconductor. Therefore, it may be difficult to directly mount the semiconductor on the mainboard, and packaging technology for buffering a difference in a circuit width between the semiconductor and the mainboard is required.

A semiconductor package manufactured by the packaging technology may be classified as a fan-in semiconductor package or a fan-out semiconductor package depending on a structure and a purpose thereof.

The fan-in semiconductor package and the fan-out semiconductor package will hereinafter be described in more detail with reference to the drawings.

Fan-in Semiconductor Package

FIGS. 3A and 3B are schematic cross-sectional views illustrating states of a fan-in semiconductor package before and after being packaged.

Figure 4:
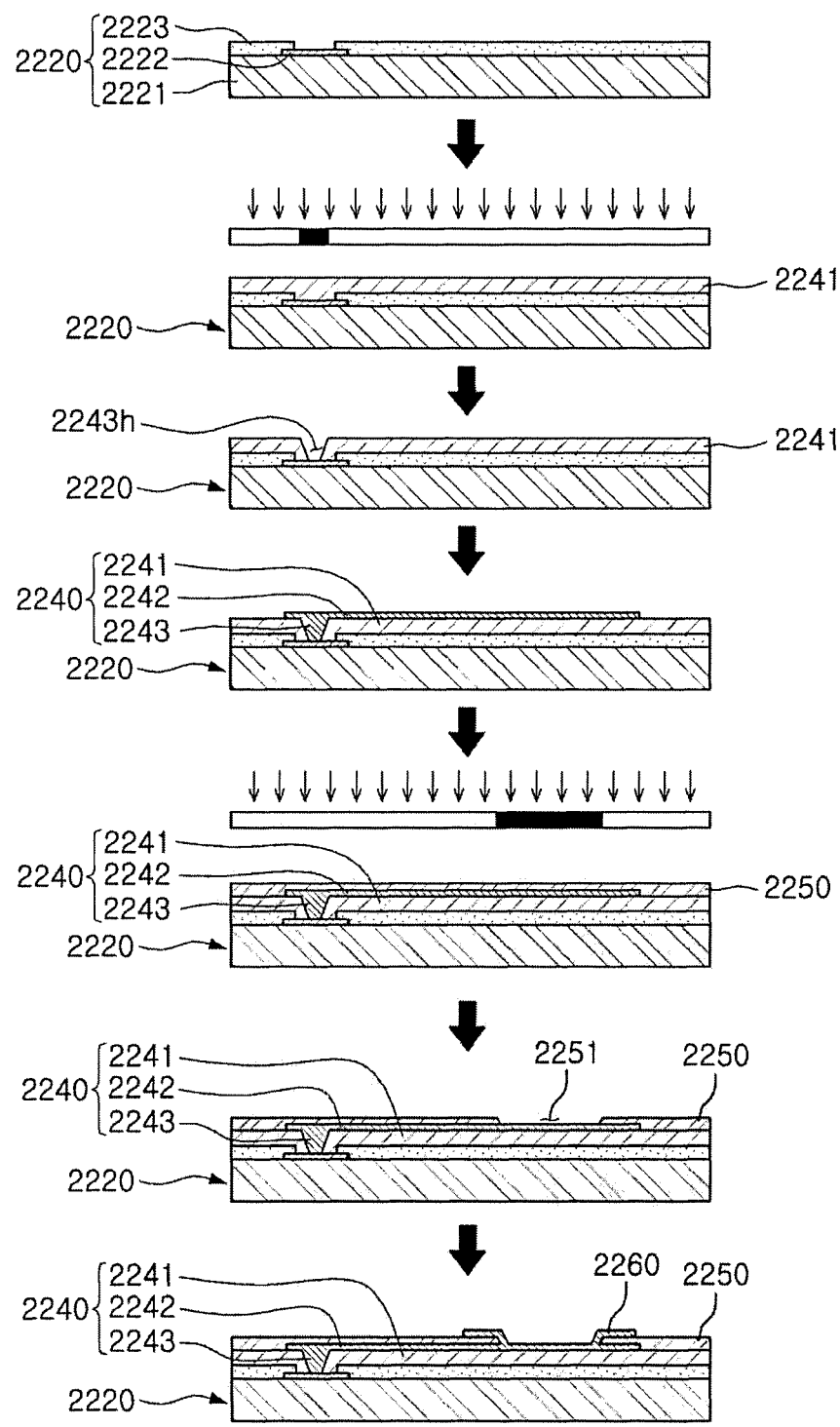
FIG. 4 is schematic cross-sectional views illustrating a packaging process of a fan-in semiconductor package.

FIG. 4 is schematic cross-sectional views illustrating a packaging process of a fan-in semiconductor package.

Referring to FIGS. 3 and 4, a semiconductor chip 2220 may be, for example, an integrated circuit (IC) in a bare state, including a body 2221 including silicon (Si), germanium (Ge), gallium arsenide (GaAs), or the like, first connection pads 2222 formed on one surface of the body 2221 and including a conductive material such as aluminum (Al), or the like, and a passivation layer 2223 such as an oxide layer, a nitride layer, or the like, formed on one surface of the body 2221 and covering at least portions of the first connection pads 2222. In this case, since the first connection pads 2222 may be significantly small, it may be difficult to mount the integrated circuit (IC) on an intermediate level printed circuit board (PCB) as well as on the mainboard of the electronic device, or the like.

Therefore, a connection member 2240 may be formed depending on a size of the semiconductor chip 2220 on the semiconductor chip 2220 in order to redistribute the first connection pads 2222. The connection member 2240 may be formed by forming an insulating layer 2241 on the semiconductor chip 2220 using an insulating material such as a photoimagable dielectric (PID) resin, forming via holes 2243h opening the first connection pads 2222, and then forming wiring patterns 2242 and vias 2243. Then, a passivation layer 2250 protecting the connection member 2240 may be formed, an opening 2251 may be formed, and an underbump metal layer 2260, or the like, may be formed. That is, a fan-in semiconductor package 2200 including, for example, the semiconductor chip 2220, the connection member 2240, the passivation layer 2250, and the underbump metal layer 2260 may be manufactured through a series of processes.

As described above, the fan-in semiconductor package may have a package form in which all of the first connection pads, for example, input/output (I/O) terminals, of the semiconductor are disposed inside the semiconductor, and may have excellent electrical characteristics and be produced at a low cost. Therefore, many elements mounted in smartphones have been manufactured in a fan-in semiconductor package form. In detail, many elements mounted in smartphones have been developed to implement a rapid signal transfer while having a compact size.

However, since all I/O terminals need to be disposed inside the semiconductor in the fan-in semiconductor package, the fan-in semiconductor package has significant spatial limitations. Therefore, it is difficult to apply this structure to a semiconductor having a large number of I/O terminals or a semiconductor having a compact size. In addition, due to the disadvantage described above, the fan-in semiconductor package may not be directly mounted and used on the mainboard of the electronic device. The reason is that even in the case in which a size of the I/O terminals of the semiconductor and an interval between the I/O terminals of the semiconductor are increased by a redistribution process, the size of the I/O terminals of the semiconductor and the interval between the I/O terminals of the semiconductor may not be sufficient to directly mount the fan-in semiconductor package on the mainboard of the electronic device.

Figure 5:
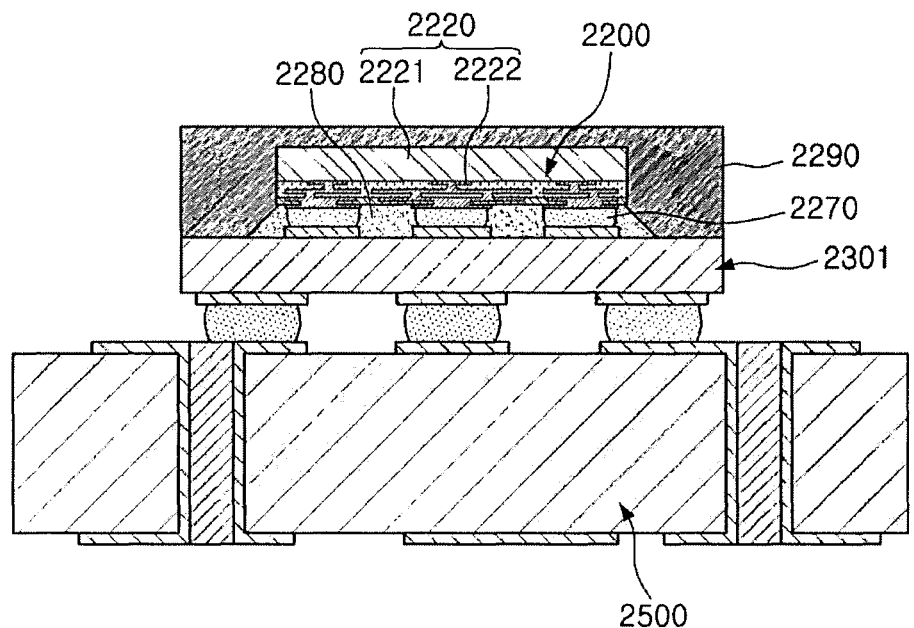
FIG. 5 is a schematic cross-sectional view illustrating a case in which a fan-in semiconductor package is mounted on a ball grid array (BGA) substrate and is ultimately mounted on a mainboard of an electronic device.

FIG. 5 is a schematic cross-sectional view illustrating a case in which a fan-in semiconductor package is mounted on a ball grid array (BGA) substrate and is ultimately mounted on a mainboard of an electronic device.

Figure 6:
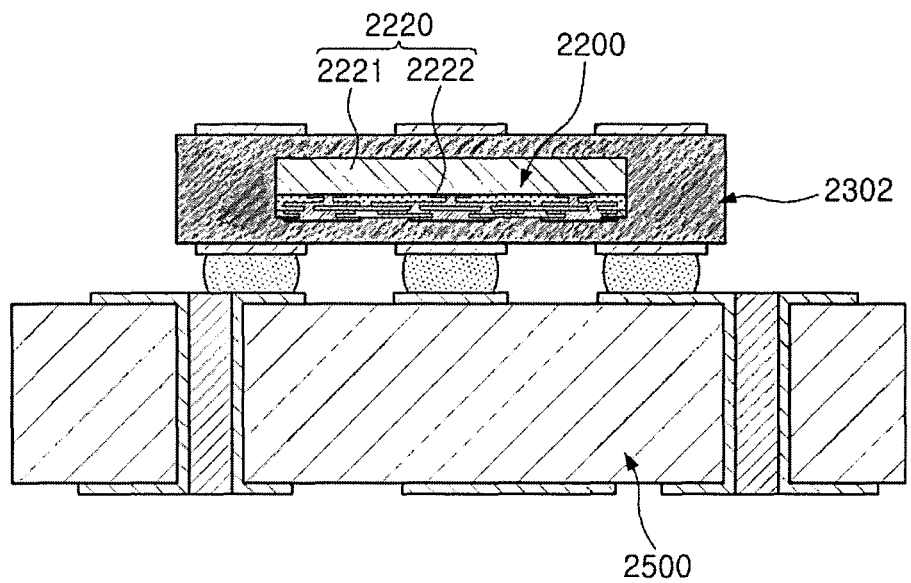
FIG. 6 is a schematic cross-sectional view illustrating a case in which a fan-in semiconductor package is embedded in a BGA substrate and is ultimately mounted on a mainboard of an electronic device.

FIG. 6 is a schematic cross-sectional view illustrating a case in which a fan-in semiconductor package is embedded in a BGA substrate and is ultimately mounted on a mainboard of an electronic device.

Referring to FIGS. 5 and 6, in a fan-in semiconductor package 2200, first connection pads 2222, that is, I/O terminals, of a semiconductor chip 2220 may be redistributed through a BGA substrate 2301, and the fan-in semiconductor package 2200 may be ultimately mounted on a mainboard 2500 of an electronic device in a state in which it is mounted on the BGA substrate 2301. In this case, solder balls 2270, and the like, may be fixed by an underfill resin 2280, or the like, and an outer side of the semiconductor chip 2220 may be covered with a molding material 2290, or the like. Alternatively, a fan-in semiconductor package 2200 may be embedded in a separate BGA substrate 2302, first connection pads 2222, that is, I/O terminals, of the semiconductor chip 2220 may be redistributed by the BGA substrate 2302 in a state in which the fan-in semiconductor package 2200 is embedded in the BGA substrate 2302, and the fan-in semiconductor package 2200 may be ultimately mounted on a mainboard 2500 of an electronic device.

As described above, it may be difficult to directly mount and use the fan-in semiconductor package on the mainboard of the electronic device. Therefore, the fan-in semiconductor package may be mounted on the separate BGA substrate and be then mounted on the mainboard of the electronic device through a packaging process or may be mounted and used on the mainboard of the electronic device in a state in which it is embedded in the BGA substrate.

Fan-Out Semiconductor Package

Figure 7:
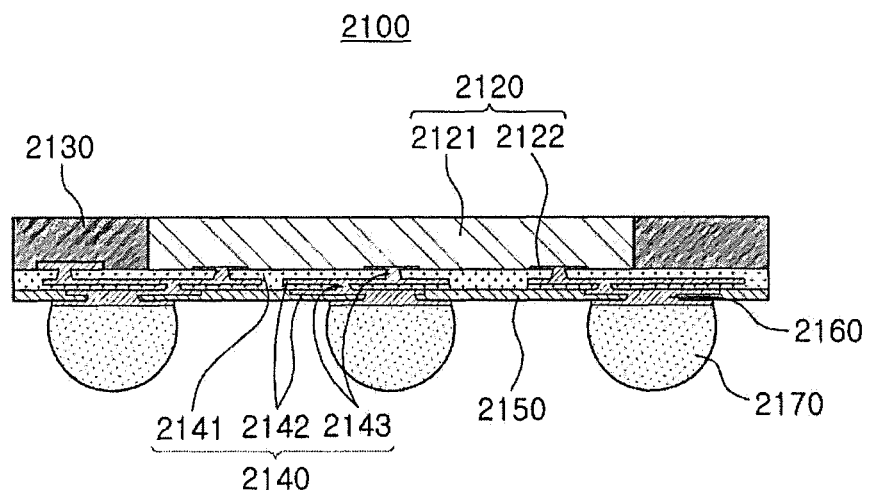
FIG. 7 is a schematic cross-sectional view illustrating a fan-out semiconductor package.

FIG. 7 is a schematic cross-sectional view illustrating a fan-out semiconductor package.

Referring to FIG. 7, in a fan-out semiconductor package 2100, for example, an outer side of a semiconductor chip 2120 may be protected by an encapsulant 2130, and first connection pads 2122 of the semiconductor chip 2120 may be redistributed outwardly of the semiconductor chip 2120 by a connection member 2140. In this case, a passivation layer 2150 may further be formed on the connection member 2150, and an underbump metal layer 2160 may further be formed in openings of the passivation layer 2150. Solder balls 2170 may further be formed on the underbump metal layer 2160. The semiconductor chip 2120 may be an integrated circuit (IC) including a body 2121, the first connection pads 2122, a passivation layer (not illustrated), and the like. The connection member 2140 may include an insulating layer 2141, redistribution layers 2142 formed on the insulating layer 2141, and vias 2143 electrically connecting the first connection pads 2122 and the redistribution layers 2142 to each other.

As described above, the fan-out semiconductor package may have a form in which I/O terminals of the semiconductor are redistributed and disposed outwardly of the semiconductor through the connection member formed on the semiconductor. As described above, in the fan-in semiconductor package, all I/O terminals of the semiconductor need to be disposed inside the semiconductor. Therefore, when a size of the semiconductor is decreased, a size and a pitch of balls need to be decreased, such that a standardized ball layout may not be used in the fan-in semiconductor package. On the other hand, the fan-out semiconductor package has the form in which the I/O terminals of the semiconductor are redistributed and disposed outwardly of the semiconductor through the connection member formed on the semiconductor as described above. Therefore, even in the case in which a size of the semiconductor is decreased, a standardized ball layout may be used in the fan-out semiconductor package as it is, such that the fan-out semiconductor package may be mounted on the mainboard of the electronic device without using a separate BGA substrate, as described below.

Figure 8:
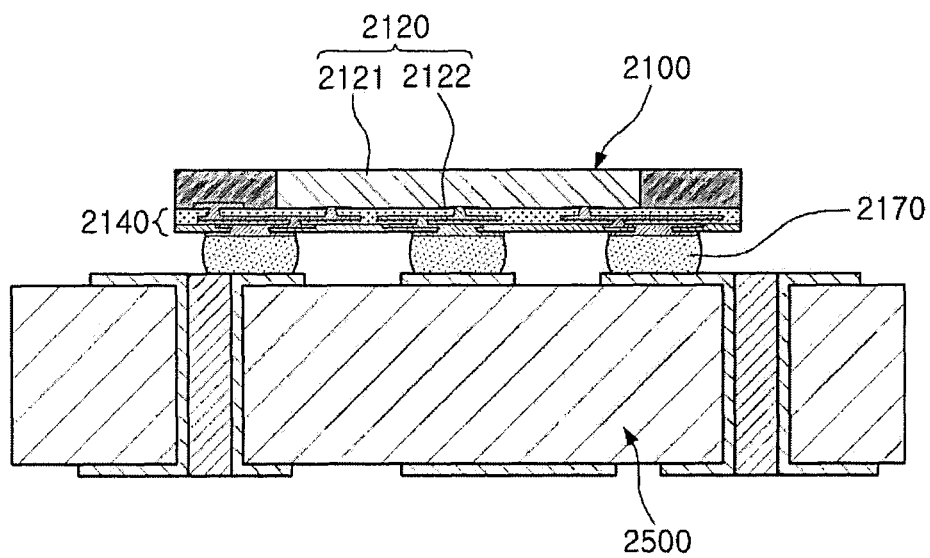
FIG. 8 is a schematic cross-sectional view illustrating a case in which a fan-out semiconductor package is mounted on a mainboard of an electronic device.

FIG. 8 is a schematic cross-sectional view illustrating a case in which a fan-out semiconductor package is mounted on a mainboard of an electronic device.

Referring to FIG. 8, a fan-out semiconductor package 2100 may be mounted on a mainboard 2500 of an electronic device through solder balls 2170, or the like. That is, as described above, the fan-out semiconductor package 2100 includes the connection member 2140 formed on the semiconductor chip 2120 and capable of redistributing the first connection pads 2122 to a fan-out region that is outside of a size of the semiconductor chip 2120, such that the standardized ball layout may be used in the fan-out semiconductor package 2100 as it is. As a result, the fan-out semiconductor package 2100 may be mounted on the mainboard 2500 of the electronic device without using a separate BGA substrate, or the like.

As described above, since the fan-out semiconductor package may be mounted on the mainboard of the electronic device without using the separate BGA substrate, the fan-out semiconductor package may be implemented at a thickness lower than that of the fan-in semiconductor package using the BGA substrate. Therefore, the fan-out semiconductor package may be miniaturized and thinned. In addition, the fan-out electronic component package has excellent thermal characteristics and electrical characteristics, such that it is particularly appropriate for a mobile product. Therefore, the fan-out electronic component package may be implemented in a form more compact than that of a general package-on-package (POP) type using a printed circuit board (PCB), and may solve a problem due to the occurrence of a warpage phenomenon.

Meanwhile, the fan-out semiconductor package refers to package technology for mounting the semiconductor on the mainboard of the electronic device, or the like, as described above, and protecting the semiconductor from external impacts, and is a concept different from that of a printed circuit board (PCB) such as a BGA substrate, or the like, having a scale, a purpose, and the like, different from those of the fan-out semiconductor package, and having the fan-in semiconductor package embedded therein.

A fan-out sensor package according to the present disclosure may be manufactured using the fan-out semiconductor package technology described above. A fan-out sensor package according to the present disclosure will hereinafter be described with reference to the drawings.

Figure 9:
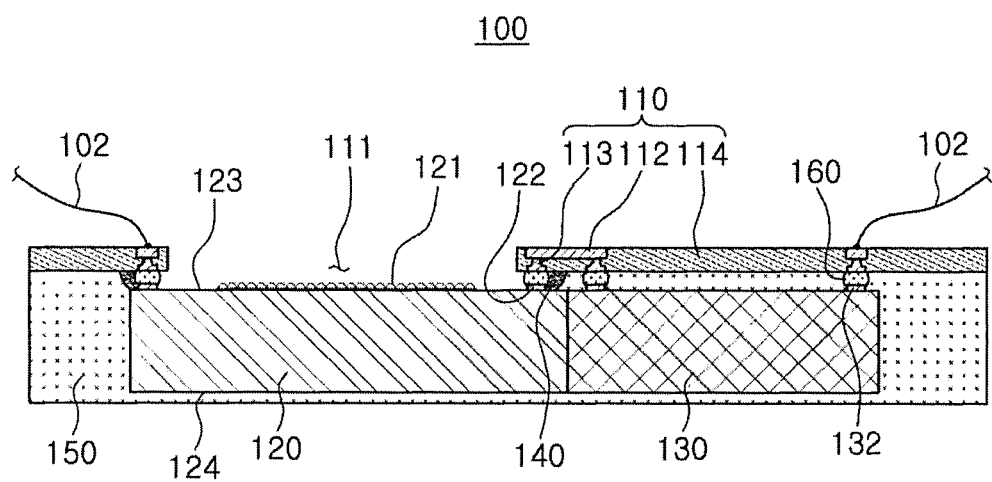
FIG. 9 is a schematic cross-sectional view illustrating a fan-out sensor package according to a first exemplary embodiment in the present disclosure.

FIG. 9 is a schematic cross-sectional view illustrating a fan-out sensor package according to a first exemplary embodiment in the present disclosure.

Referring to FIG. 9, a fan-out sensor package 100 according to a first exemplary embodiment in the present disclosure may include a redistribution portion 110, a first semiconductor chip 120, a second semiconductor chip 130, dam members 140, an encapsulant 150, and electrical connection structures 160 as an example.

The redistribution portion 110 may have a through-hole 111, and include wiring layers 112 and vias 113. As an example, the redistribution portion 110 may include insulating layers 114 in which the through-hole 111 is formed, the wiring layers 112 formed on the insulating layers 114, and the vias 113 connected to the wiring layers 112.

A material of each of the insulating layers 114 may be an insulating material. In this case, the insulating material may be a photosensitive insulating material such as a PID resin. That is, each of the insulating layers 114 may be a photosensitive insulating layer. When the insulating layer 114 has photosensitive properties, the insulating layer 114 may be formed to have a smaller thickness, and a fine pitch of the via 113 may be achieved more easily. Each of the insulating layers 114 may be a photosensitive insulating layer including an insulating resin and an inorganic filler. When the insulating layers 114 are multiple layers, materials of the insulating layers 114 may be the same as each other, and may also be different from each other depending on design requirements. When the insulating layers 114 are the multiple layers, the insulating layers 114 may be integrated with each other depending on a process, such that a boundary therebetween may also not be apparent.

Each of the wiring layers 112 may serve to substantially redistribute first connection pads 122 of a first semiconductor chip 120 to be described below. A material of wiring layer 112 may be a conductive material such as copper (Cu), aluminum (Al), silver (Ag), tin (Sn), gold (Au), nickel (Ni), lead (Pb), titanium (Ti), or alloys thereof. The wiring layers 112 may perform various functions depending on designs of corresponding layers. For example, the wiring layers 112 may include ground patterns, power patterns, signal patterns, and the like. Here, the signal patterns may include various signals except for the ground patterns, the power patterns, and the like, such as data signals, and the like. In addition, the wiring layers 112 may include various pad patterns, and the like.

As an example, portions of the wiring layer 112 may be disposed to be exposed from an upper surface of the insulating layer 114.

Each of the vias 113 may be disposed so that one end thereof is connected to the wiring layer 112 and the other end thereof is exposed from a lower surface of the insulating layer 114. As an example, a material of each of the vias 13 may be a conductive material such as copper (Cu), aluminum (Al), silver (Ag), tin (Sn), gold (Au), nickel (Ni), lead (Pb), titanium (Ti), or alloys thereof, similar to that of the wiring layer 112.

Meanwhile, the other ends of the vias 113 may be electrically connected to the first connection pads 122 through the electrical connection structures 160.

In addition, bonding wires 102 may be connected to the wiring layer 112. The bonding wires 102 may play a role for electrical connection to a mainboard (not illustrated).

The first semiconductor chip 120 may have an active surface 123 having a sensing region 121 of which at least a portion is exposed through the through-hole 111 and the first connection pads 122 disposed in the vicinity of the sensing region 121, and an inactive surface 124 opposing the active surface 123.

The term "vicinity" as used herein refers to an area immediately neighboring a particular defined feature or structure without overlapping another defined feature or structure, the general size of which is determined based on the design parameters of the structure. For example, the "vicinity" of a structure or feature may be an area having a width of about 10%, about 15%, about 20%, or any number between these percentages, of the characteristic dimension of the structure or feature immediately outside the area of the structure or feature. Thus, in some embodiments, the vicinity of a structure may be an area equal to, double, quadruple, eight times, nine times, sixteen times, or any other multiplier between any two of these numbers, the area of that structure. Thus, if a connection pad has a size of 10 µm×10 µm, the vicinity may be an area surrounding the connection pad having a size of about 15 µm×15 µm, 20 µm×20 µm, 25 µm×25 µm, 30 µm×30 µm, or 40 µm×40 µm. On the other hand, the "vicinity" of a sensor element having a size of 500 µm×500 µm, may be, for example, a 50 µm, 60 µm, 75 µm or 100 µm wide strip surrounding the sensor element. It must be noted that the extent to which the "vicinity" extends is determined by design parameters such as, for example, distance between defined structures or features. For example, if two neighboring connection pads, having a size of 10 µm×10 µm each, are separated by an edge-to-edge distance 20 µm, the "vicinity" may be a strip of 2 µm width around all the edges of each of the connection pads. On the other hand, for a sensor element having a size of 500 µm×500 µm, if the sensing region is a central portion of if the sensor element with a size of 400 µm×400 µm, the "vicinity" may be a strip having a width of about 50 µm, about 60 µm, about 75 µm or about 100 µm surrounding the sensing region.

As an example, the first semiconductor chip 120 may be a complementary metal oxide semiconductor (CMOS) image sensor (CIS), but is not limited thereto. The first semiconductor chip 120 may be formed on the basis of an active wafer. In this case, a base material of a body of the first semiconductor chip may be silicon (Si), germanium (Ge), gallium arsenide (GaAs), or the like. Various circuits may be formed on the body. The first connection pads 122 may electrically connect the first semiconductor chip 120 to other components, and a conductive material such as aluminum (Al), or the like, may be used as a material of each of the first connection pads 122.

The first semiconductor chip 120 may be any one of sensor products having a structure in which a sensing region is exposed to the air among sensors used in electronic devices, mobile devices, smartphones, IoT products, or a sensor network device, that is, a chemical sensor detecting chemical substances, particles, or the like, in the air, an image sensor receiving and recognizing light, an optical sensor such as an infrared (IR) sensor or an ultraviolet (UV) sensor, a MIC sensor recognizing a user's voice, and a fingerprint sensor analyzing a fingerprint, as an example.

The second semiconductor chip 130 may be disposed side by side with the first semiconductor chip 120 in a horizontal direction, and may have second connection pads 132. In other words, the first and second semiconductor chips 120 and 130 are disposed adjacent to each other in a horizontal direction such that at least one side wall of the first semiconductor chip 120 is in physical contact with or adjacent to at least one side wall of the second semiconductor chip 130, the corresponding sidewalls being perpendicular to corresponding active surfaces. The second connection pads 132 may be connected to the redistribution portion 110, and the wiring layers 112 may serve to redistribute the second connection pads 132 of the second semiconductor chip 130. As an example, the second semiconductor chip 130 may be an integrated circuit (IC) provided in an amount of several hundred to several million or more elements integrated in a single chip, an active element, or the like. The second semiconductor chip 130 may be a semiconductor chip in which an integrated circuit is packaged in a flip-chip form, if necessary. The IC may be, for example, an application processor chip such as a central processor (for example, a CPU), a graphic processor (for example, a GPU), a digital signal processor, a cryptographic processor, a microprocessor, a micro controller, or the like, but is not limited thereto.

The second semiconductor chip 130 may be disposed to be in contact with a side surface of the first semiconductor chip 120 as an example. Therefore, a circuit connection distance between the first semiconductor chip 120 and the second semiconductor chip 130 may be significantly reduced, such that high speed communications between the first semiconductor chip 120 and the second semiconductor chip 130 may be easily performed.

Further, the second semiconductor chip 130 and the first semiconductor chip 120 may be mounted integrally with each other at a time in the redistribution portion 110 by a chip-last method.

The dam members 140 may be disposed in the vicinity of the first connection pads 122. Therefore, the dam members 140 may serve to prevent the encapsulant 150 from being introduced into the sensing region 121. As an example, the dam members 140 may be formed of a material different from that of the encapsulant 150. That is, an insulating material different from an insulating material used as a material of the encapsulant 150 may be used as a material of the dam member 140. In addition, an insulating material used as the material of the dam member 140 may be a thermosetting resin such as an epoxy resin, a thermoplastic resin such as a polyimide resin, a resin having a reinforcing material such as an inorganic filler impregnated in the thermosetting resin and the thermoplastic resin, for example, Ajinomoto Build-up Film (ABF), FR-4, Bismaleimide Triazine (BT), a photoimagable dielectric (PID) resin, or the like. In addition, any known molding material such as an EMC, or the like, may also be used. Alternatively, a resin in which a thermosetting resin or a thermoplastic resin is impregnated together with an inorganic filler in a core material such as a glass fiber (or a glass cloth or a glass fabric) may also be used as the insulating material.

The encapsulant 150 may encapsulate the redistribution portion 110, the first semiconductor chip 120, and the second semiconductor chip 130. In addition, the encapsulant 150 may serve to protect the first semiconductor chip 120 and the second semiconductor chip 130. An encapsulation form of the encapsulant 150 is not particularly limited, but may be a form in which the encapsulant 150 surrounds at least portions of the first semiconductor chip 120. As an example, the encapsulant 150 may cover the inactive surface 124 of the first semiconductor chip 120 and a lower surface of the second semiconductor chip 130.

In addition, materials of the encapsulant 150 are not particularly limited. For example, an insulating material may be used as the material of the encapsulant 150. In this case, the insulating material may be a thermosetting resin such as an epoxy resin, a thermoplastic resin such as polyimide, a resin having a reinforcing material such as an inorganic filler impregnated in the thermosetting resin and the thermoplastic resin, for example, ABF, FR-4, BT, a PID resin, or the like. In addition, any known molding material such as an EMC, or the like, may also be used. Alternatively, a resin in which a thermosetting resin or a thermoplastic resin is impregnated together with an inorganic filler in a core material such as a glass fiber (or a glass cloth or a glass fabric) may also be used as the insulating material.

The electrical connection structures 160 may electrically connect the first connection pads 122 and the second connection pads 132 to the vias 113 of the redistribution portion 110.

Each of the electrical connection structures 160 may be formed of a low melting point material including a solder, or the like. However, this is only an example, and a material of each of the electrical connection structures 160 is not particularly limited thereto. Each of the electrical connection structures 160 may be a land, a ball, a pin, or the like. The electrical connection structures 160 may be formed as a multilayer or single layer structure. When the electrical connection structures 160 are formed as a multilayer structure, the electrical connection structures 160 may include a copper (Cu) pillar and a solder. When the electrical connection structures 160 are formed as a single layer structure, the electrical connection structures 160 may include a tin-silver solder or copper (Cu). However, these are only a few examples, and the electrical connection structures 160 are not limited thereto.

The number, an interval, a disposition form, and the like, of electrical connection structures 160 are not particularly limited, but may be sufficiently modified depending on design particulars by those skilled in the art. For example, the electrical connection structures 160 may be provided in an amount of several tens to several thousands according to the number of first connection pads 122 of the first semiconductor chip 120, or may be provided in an amount of several tens to several thousands or more or several tens to several thousands or less.

At least one of the electrical connection structures 160 may be disposed in a fan-out region. The fan-out region refers to a region except for the region in which the first semiconductor chip 120 is disposed. The fan-out package may have excellent reliability as compared to a fan-in package, may implement a plurality of input/output (I/O) terminals, and may facilitate a 3D interconnection. In addition, as compared to a ball grid array (BGA) package, a land grid array (LGA) package, or the like, the fan-out package may be manufactured to have a small thickness, and may have price competitiveness.

As described above, the first semiconductor chip 120 and the second semiconductor chip 130 may be mounted in the redistribution portion 110 by the chip-last method, and the circuit connection distance between the first semiconductor chip 120 and the second semiconductor chip 130 may thus be reduced, such that the high speed communications between the first semiconductor chip 120 and the second semiconductor chip 130 may be easily performed.

In addition, an additional process or equipment for connection between the fan-out sensor package 100 and a mainboard (a printed circuit board (PCB)) is not required, and a manufacturing yield of the fan-out sensor package may thus be improved.

A method of manufacturing a fan-out sensor package according to a first exemplary embodiment in the present disclosure will hereinafter be described with reference to the drawings.

FIGS. 10 through 17 are views for describing a method of manufacturing a fan-out sensor package according to a first exemplary embodiment in the present disclosure.

Figure 10:
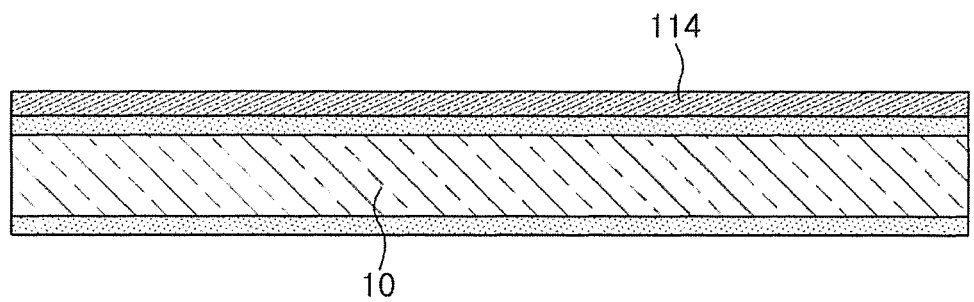
FIGS. 10 through 17 are views for describing a method of manufacturing a fan-out sensor package according to a first exemplary embodiment in the present disclosure.

First, as illustrated in FIG. 10, the insulating layer 114 of the redistribution portion 110 may be formed on a carrier 10. The insulating layer 114 may be formed of an insulating material. In this case, the insulating material may be a photosensitive insulating material such as a PID resin.

Figure 11:
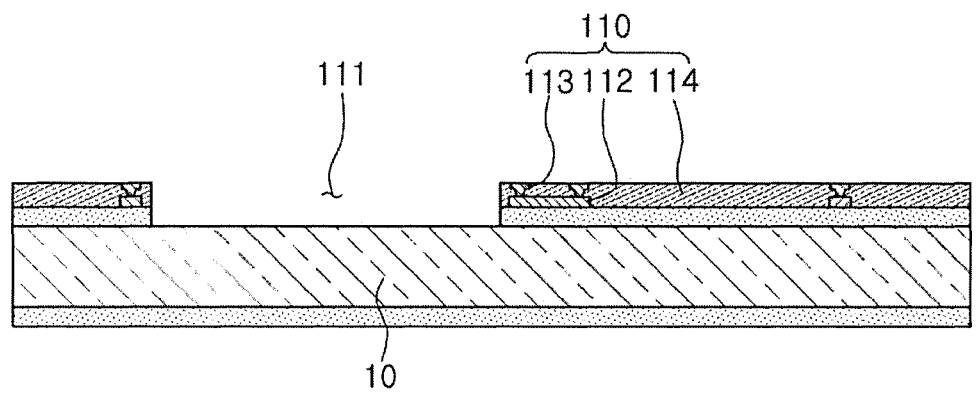

Then, as illustrated in FIG. 11, the wiring layer 112 and the vias 113 may be formed on the insulating layer 114. As an example, one end of each of the vias 113 may be exposed from the insulating layer 114. Meanwhile, a material of each of the wiring layer 112 and the vias 113 may be a conductive material such as copper (Cu), aluminum (Al), silver (Ag), tin (Sn), gold (Au), nickel (Ni), lead (Pb), titanium (Ti), or alloys thereof.

Further, the through-hole 111 may be formed in the insulating layer 114.

Figure 12:
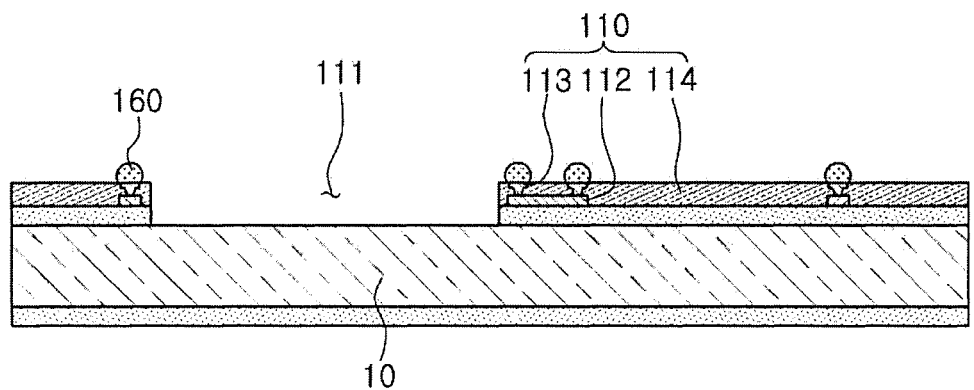

Then, as illustrated in FIG. 12, the electrical connection structures 160 may be formed on the vias 113. The electrical connection structures 160 may serve to mechanically couple the first semiconductor chip 120 and the second semiconductor chip 130 to the redistribution portion 110 while serving to electrically connect first connection pads 122 of a first semiconductor chip 120 and second connection pads 132 of a second semiconductor chip 130 to be described above to the vias 113.

Figure 13:
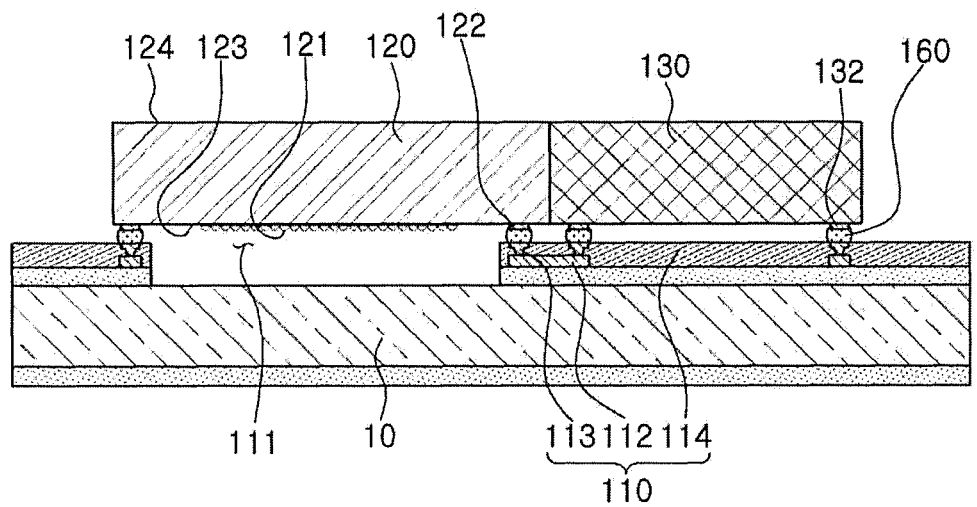

Then, as illustrated in FIG. 13, the first semiconductor chip 120 and the second semiconductor chip 130 may be mounted. In this case, as described above, the first semiconductor chip 120 and the second semiconductor chip 130 may be mounted on the electrical connection structures 160 so that the first connection pads 122 of the first semiconductor chip 120 and the second connection pads 132 of the second semiconductor chip 130 are electrically connected to the vias 113. As described above, the first semiconductor chip 120 and the second semiconductor chip 130 may be packaged integrally with each other and be mounted in the redistribution portion 110 by the chip-last method to reduce the circuit connection distance between the first semiconductor chip 120 and the second semiconductor chip 130, such that the high speed communications between the first semiconductor chip 120 and the second semiconductor chip 130 may be easily performed.

Figure 14:
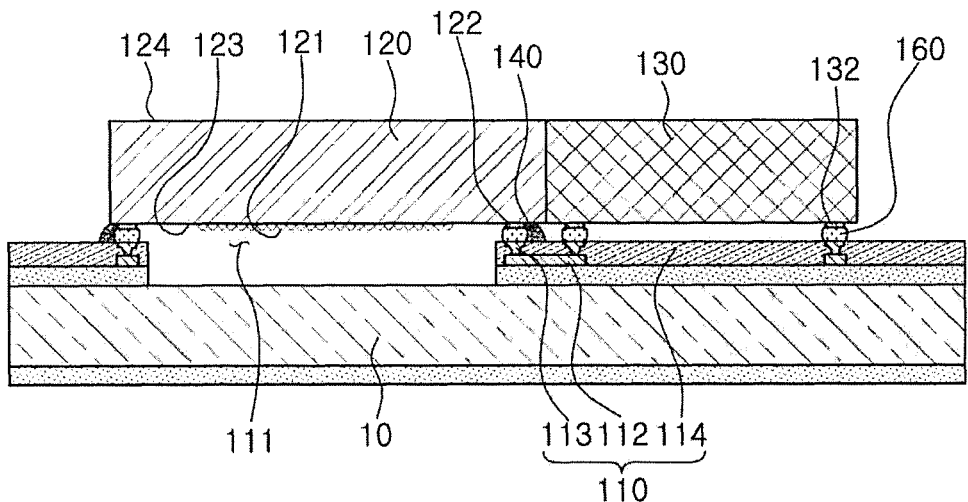

Then, as illustrated in FIG. 14, the dam members 140 may be formed in the vicinity of the first connection pads 122. The insulating material used as the material of the dam member 140 may be a thermosetting resin such as an epoxy resin, a thermoplastic resin such as a polyimide resin, a resin having a reinforcing material such as an inorganic filler impregnated in the thermosetting resin and the thermoplastic resin, for example, ABF, FR-4, BT, a PID resin, or the like. In addition, any known molding material such as an EMC, or the like, may also be used. Alternatively, a resin in which a thermosetting resin or a thermoplastic resin is impregnated together with an inorganic filler in a core material such as a glass fiber (or a glass cloth or a glass fabric) may also be used as the insulating material.

Meanwhile, the dam members 140 may serve to prevent the encapsulant 150 from being introduced into the sensing region 121 of the first semiconductor chip 120 at the time of forming the encapsulant 150.

Figure 15:
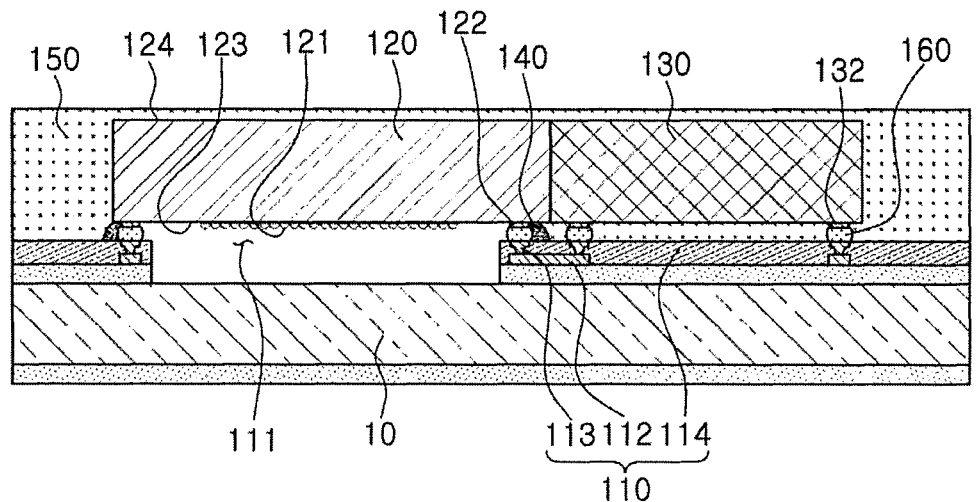

Then, as illustrated in FIG. 15, the redistribution portion 110, the first semiconductor chip 120, and the second semiconductor chip 130 may be encapsulated through the encapsulant 150. Meanwhile, the encapsulant 150 may cover the inactive surface 124 of the first semiconductor chip 120 and an upper surface of the second semiconductor chip 130. Meanwhile, certain materials of the encapsulant 150 are not particularly limited. For example, an insulating material may be used as the certain materials of the encapsulant 150. In this case, the insulating material may be a thermosetting resin such as an epoxy resin, a thermoplastic resin such as polyimide, a resin having a reinforcing material such as an inorganic filler impregnated in the thermosetting resin and the thermoplastic resin, for example, ABF, FR-4, BT, a PID resin, or the like. In addition, any known molding material such as an EMC, or the like, may also be used. Alternatively, a resin in which a thermosetting resin or a thermoplastic resin is impregnated together with an inorganic filler in a core material such as a glass fiber (or a glass cloth or a glass fabric) may also be used as the insulating material.

Figure 16:
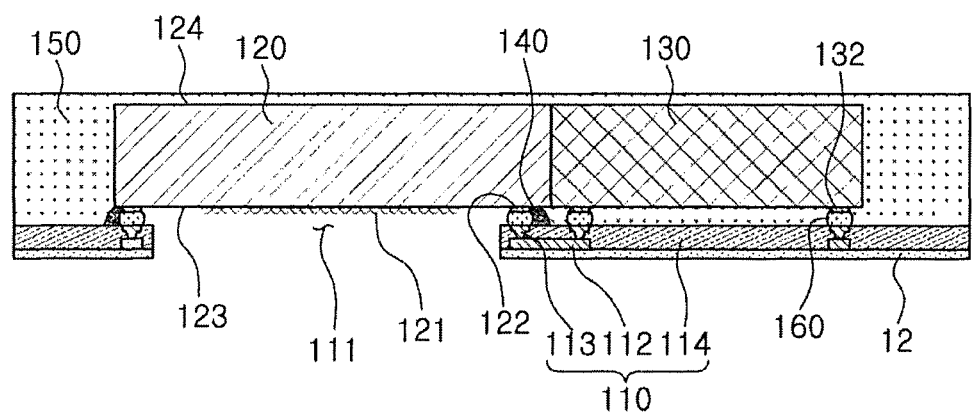

Then, as illustrated in FIG. 16, the carrier 10 except for a copper layer 12 included in the carrier 10 may be removed.

Figure 17:
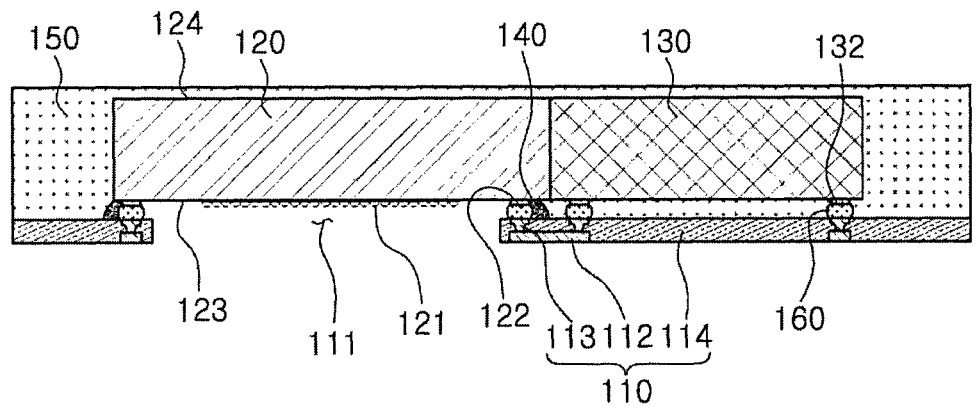

Then, as illustrated in FIG. 17, the copper layer 12 may be removed by etching. Therefore, the sensing region 121 of the first semiconductor chip 120 may be exposed through the through-hole 111 of the redistribution portion 110.

A fan-out sensor package according to a second exemplary embodiment in the present disclosure will hereinafter be described with reference to the drawings.

Figure 18:
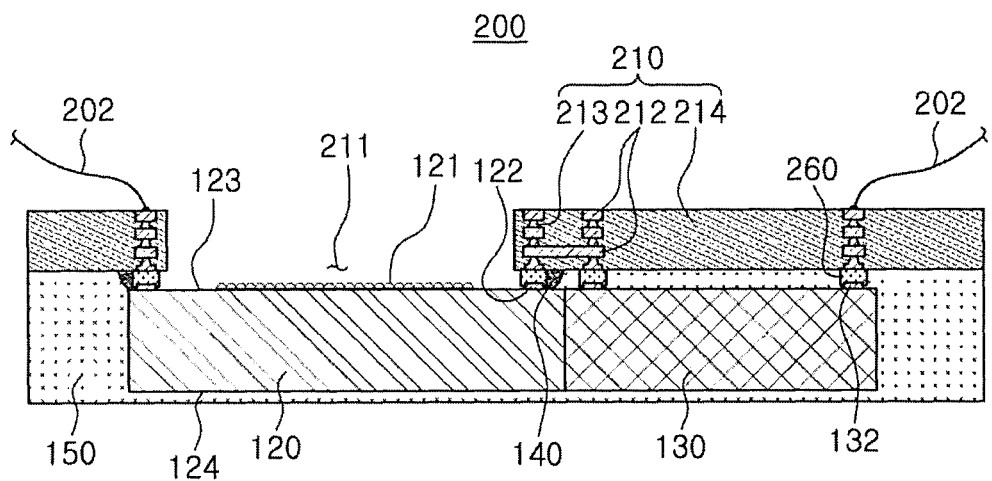
FIG. 18 is a schematic cross-sectional view illustrating a fan-out sensor package according to a second exemplary embodiment in the present disclosure.

FIG. 18 is a schematic cross-sectional view illustrating a fan-out sensor package according to a second exemplary embodiment in the present disclosure.

Referring to FIG. 18, a fan-out sensor package 200 according to a second exemplary embodiment in the present disclosure may include a redistribution portion 210, a first semiconductor chip 120, a second semiconductor chip 130, dam members 140, an encapsulant 150, and electrical connection structures 260 as an example.

Meanwhile, since the first semiconductor chip 120, the second semiconductor chip 130, the dam members 140, and the encapsulant 150 are substantially the same as those of the fan-out sensor package 100 according to the first exemplary embodiment described above, a detailed description therefor is omitted and is replaced by the abovementioned description.

A redistribution portion 210 may include an insulating layer 214 in which a through-hole 211 is formed, a plurality of wiring layers 212 exposed to an upper surface and a lower surface of the insulating layer 214, and vias 213 connecting the wiring layers 212 to each other.

Meanwhile, the wiring layer 212 exposed to the lower surface of the insulating layer 214 may be connected to the first connection pads 122 of the first semiconductor chip 120 and the second connection pads 132 of the second semiconductor chip 130 through the electrical connection structures 260.

In addition, bonding wires 202 may be connected to the wiring layer 212 exposed to the upper surface of the insulating layer 214.

The electrical connection structures 260 may serve to electrically connect the first connection pads 122 and the second connection pads 132 to the wiring layer 212 exposed to the lower surface of the insulating layer 214 to mechanically couple the first semiconductor chip 120 and the second semiconductor chip 130 to the redistribution portion 210.

Meanwhile, each of the electrical connection structures 260 may be formed of a bump.

Meanwhile, the fan-out sensor packages 100 and 200 according to the first and second embodiments described above may be used in a camera module. In this case, the first semiconductor chip 120 may be an image semiconductor chip.

Further, the redistribution portion 110 or 210 may be electrically connected to a mainboard (a PCB) through the bonding wires 102 or 202.

As set forth above, according to exemplary embodiments in the present disclosure, a manufacturing yield of a fan-out sensor package may be improved.

While exemplary embodiments have been shown and described above, it will be apparent to those skilled in the art that modifications and variations could be made without departing from the scope of the present invention as defined by the appended claims.

What is claimed is:

1. A fan-out sensor package comprising:
a redistribution portion having a through-hole and including a wiring layer and vias;
a first semiconductor chip having an active surface having a sensing region of which at least a portion is exposed through the through-hole and first connection pads disposed in the vicinity of the sensing region;
a second semiconductor chip disposed side by side with the first semiconductor chip in a horizontal direction and having second connection pads;
dam members disposed in the vicinity of the first connection pads;
an encapsulant encapsulating the redistribution portion, the first semiconductor chip, and the second semiconductor chip; and
electrical connection structures electrically connecting the first connection pads and the second connection pads to the wiring layer and the vias of the redistribution portion,
wherein the first and second semiconductor chips are disposed such that a side surface of the first semiconductor chip directly contacts a side surface of the second semiconductor chip.

2. The fan-out sensor package of claim 1, wherein a bonding wire is connected to the wiring layer.

3. The fan-out sensor package of claim 1, wherein the redistribution portion includes
an insulating layer in which the through-hole is formed,
the wiring layer exposed to an upper surface of the insulating layer, and
the vias connected to the wiring layer and having a lower surface exposed to a lower surface of the insulating layer.

4. The fan-out sensor package of claim 1, wherein the dam members have a band shape.

5. The fan-out sensor package of claim 1, wherein the encapsulant covers an inactive surface opposing the active surface of the first semiconductor chip and a lower surface of the second semiconductor chip.

6. The fan-out sensor package of claim 1, wherein the electrical connection structure is formed of a low melting point material including a solder.

7. The fan-out sensor package of claim 1, wherein the second semiconductor chip is any one of an integrated circuit (IC), an active element, and a dynamic random access memory (DRAM).

8. The fan-out sensor package of claim 1, wherein the redistribution portion includes an insulating layer in which the through-hole is formed, a plurality of wiring layers exposed to an upper surface and a lower surface of the insulating layer, and the vias connecting the wiring layers to each other.

9. A fan-out sensor package, comprising:
a first semiconductor chip having a first active surface and first sidewalls perpendicular to the active surface, the active surface having a sensing region and first connection pads disposed in a portion of the active surface outside of the sensing region;
a second semiconductor chip having a second active area with second connection pads disposed thereon, and second sidewalls perpendicular to the second active area, the second semiconductor chip being disposed adjacent the first semiconductor chip such that one of the first sidewalls directly contacts one of the second sidewalls;

a redistribution portion comprising an insulating layer having a through-hole, a wiring layer and vias penetrating through the insulating layer and exposed to a first surface of the insulating layer, the redistribution portion being disposed on the first and second semiconductor chips such that respective active areas face the first surface of the insulating layer and at least a portion of the sensing region is exposed through the through-hole;

an encapsulant encapsulating the first and second semiconductor chips and at least a portion of the redistribution portion;

dam members disposed to prevent the encapsulant from contacting the sensing region; and electrical connect ion structures electrically connecting the vias and the wiring layer to the first and second connection pads.

10. The fan-out package of claim 9, wherein the redistribution portion further comprises redistribution pads disposed on a second surface opposing the first surface of the insulating layer, wherein the vias electrically connect the wiring layer to the redistribution pads.

11. The fan-out package of claim 10, wherein the redistribution pads are connected to bonding wires.

* * * * *